United States Patent
Tilton et al.

(10) Patent No.: US 7,469,551 B2
(45) Date of Patent: Dec. 30, 2008

(54) GLOBALLY COOLED COMPUTER SYSTEM

(75) Inventors: Charles L. Tilton, Colton, WA (US);
Donald E. Tilton, Colton, WA (US);
Randal T. Palmer, Liberty Lake, WA (US); Tony E. Hyde, Blanchard, ID (US)

(73) Assignee: Isothermal Systems Research, Inc., Liberty Lake, WA (US)

( * ) Notice: Subject to any disclaimer, the term of this patent is extended or adjusted under 35 U.S.C. 154(b) by 293 days.

(21) Appl. No.: 11/334,269

(22) Filed: Jan. 18, 2006

(65) Prior Publication Data

US 2006/0250755 A1 Nov. 9, 2006

Related U.S. Application Data

(60) Provisional application No. 60/645,476, filed on Jan. 18, 2005.

(51) Int. Cl.
*F25D 23/12* (2006.01)
(52) U.S. Cl. ................ 62/259.2; 62/259.4; 62/310; 361/600; 165/104.33
(58) Field of Classification Search ............. 62/64, 62/121, 171, 310, 259.2, 259.4; 165/80.4, 165/104.33, 168, 185, 908; 361/600, 689–700; 257/714, 715; 174/15.1
See application file for complete search history.

(56) References Cited

U.S. PATENT DOCUMENTS

| | | | | |
|---|---|---|---|---|
| 4,414,917 A * | 11/1983 | Bentley et al. | ............. | 118/695 |
| 5,012,041 A * | 4/1991 | Sims et al. | ................. | 174/381 |
| 5,943,211 A * | 8/1999 | Havey et al. | ................ | 361/699 |
| 6,349,554 B2 * | 2/2002 | Patel et al. | ................ | 62/259.2 |
| 6,817,204 B2 * | 11/2004 | Bash et al. | .................... | 62/304 |
| 7,000,691 B1 * | 2/2006 | Weber | ........................ | 165/281 |
| 7,055,341 B2 * | 6/2006 | Nori et al. | ................. | 62/259.2 |

FOREIGN PATENT DOCUMENTS

JP 56-49466 A * 5/1981

* cited by examiner

*Primary Examiner*—Mohammad M Ali
(74) *Attorney, Agent, or Firm*—Lee & Hayes, PLLC

(57) ABSTRACT

A globally cooled computer system for providing liquid cooling to a plurality of electrical components. The globally cooled computer system includes an electronics unit having a plurality of electronics components attached to a plurality of cards and a card cage for providing structural support to the cards, a fluid management unit for pressurizing fluid within the electronics unit, a reservoir for collecting fluid from the electronics unit, a tubing system for distributing the fluid between the electronics unit and the fluid management unit, and a pressure equalization system connecting the electronics unit and the reservoir to equalize internal pressures between them.

8 Claims, 14 Drawing Sheets

GLOBALLY COOLED COMPUTER SYSTEM

CROSS REFERENCE TO RELATE APPLICATION

This application claims priority from U.S. provisional patent application No. 60/645,476, entitled Globally Cooled Electronics System filed on Jan. 18, 2005.

STATEMENT REGARDING FEDERALLY SPONSORED R&D

This invention was made with Government support under contract #N68335-00-D-0451 awarded by the Defense Micro-Electronics Agency (DMEA). The Government has certain rights in this invention.

BACKGROUND OF THE INVENTION

The present invention relates generally to a global cooling chamber for providing liquid cooling to a plurality of electronic components. The global cooling chamber uses a non-electrically conductive fluid which is in direct contact with the components to be cooled.

DESCRIPTION OF THE RELATED ART

The present invention relates to the thermal management of electronic components that are mounted upon electronic cards (a.k.a. expansion boards) or substrates. In a card level system, a plurality of cards are electrically connected within sockets upon a backplane (e.g. motherboard, etc.). Electronic cards are utilized in various applications, such as personal computers, workstations, server computers, rack mounted services, network routers, network switches, telephone equipment (DWDMs, ADMs, TDMs, switches, repeaters and the like), and military applications (vehicle, aircraft, etc.). Examples of electronic cards include but are not limited to modems, video processors, network interfaces, processors, memory, hard drive controllers, hard drives, mouse controller, keyboard controller, global position systems, wireless cards, backplane controller cards and the like.

"Dry cooling" (i.e. air cooling) has been in usage for years for cooling electronic components. An example of a dry cooling system is a conventional desktop computer with a fan that passes air over the electronic components to cool the same. Dry cooling technology is acceptable for low powered electronic components.

Modern electronics devices have increased thermal management requirements. Conventional dry cooling technology simply is not capable of efficiently cooling modern high-end electronics. "Liquid cooling" is being adopted today as the most efficient option for thermally managing electronic systems. United States. patents: U.S. Pat. No. 5,220,804 entitled High Heat Flux Evaporative Spray Cooling to Tilton et. al. describes a high heat flux evaporative cooling system. U.S. Pat. No. 5,880,931 entitled Spray Cooled Circuit Card Cage to Tilton et. al. for a global cooling system. United States Patent Application No. 2005/0138833 A1 entitled Dry-Wet Thermal management System to Knight et. al. for a card cage.

The present invention incorporates many benefits into liquid cooling systems over the prior art. re are many benefits to incorporating liquid cooling in a global computer system as described.

BRIEF SUMMARY OF THE INVENTION

In view of the foregoing disadvantages inherent in the known types of thermal management devices now present in the prior art, the present invention provides a new globally cooled computer system for simplifying cooling of computer systems.

The general purpose of the present invention, which will be described subsequently in greater detail, is to provide a new globally cooled computer system that has many of the advantages of the thermal management devices in the prior art and many novel features that result in a new globally cooled computer system which is not anticipated, rendered obvious, suggested, or even implied by any of the prior art thermal management devices, either alone or in any combination thereof.

To attain this, the present invention generally comprises a globally cooled computer system for providing liquid cooling to a plurality of electrical components. The globally cooled computer system includes an electronics unit having a plurality of electronics components attached to a plurality of cards and a card cage for providing structural support to the cards, a fluid management unit for pressurizing fluid within the electronics unit, a reservoir for collecting fluid from the electronics unit, a tubing system for distributing the fluid between the electronics unit and the fluid management unit, and a pressure equalization system connecting the electronics unit and the reservoir to equalize internal pressures between them.

There has thus been outlined, rather broadly, the more important features of the invention in order that the detailed description thereof may be better understood, and in order that the present contribution to the art may be better appreciated. There are additional features of the invention that will be described hereinafter and that will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

A primary object of the present invention is to provide a globally cooled computer system that will overcome the shortcomings of the prior art devices.

Another object is to accomplish very effective heat transfer rates.

Another object is to provide environmental isolation of the electronics components.

Another object is to allow the system to be used and scaled in network racks.

A further object is the system has the ability to reject heat to both air and/or a secondary liquid cooling loop.

Other objects and advantages of the present invention will become obvious to the reader and it is intended that these objects and advantages are within the scope of the present invention.

To the accomplishment of the above and related objects, this invention may be embodied in the form illustrated in the accompanying drawings, attention being called to the fact, however, that the drawings are illustrative only, and that changes may be made in the specific construction illustrated and described within the scope of the appended claims.

BRIEF DESCRIPTION OF THE DRAWINGS

Preferred embodiments of the invention are described below with the reference to the following accompanying drawings.

DETAILED DESCRIPTION OF THE PREFERRED EMBODIMENTS

Many of the fastening and fluid components utilized and described in this invention are widely known and used in the field of the invention, and their exact nature or type is not necessary for a person of ordinary skill in the art or science to understand the invention; therefore they will not be discussed in detail.

Applicants hereby incorporate by reference the following U.S. patents: U.S. Pat. No. 5,220,804 for a high heat flux evaporative cooling system; U.S. Pat. No. 5,880,931 for a global cooling system; and U.S. Pat. No. 5,880,931 for a card cage.

Figure 1:
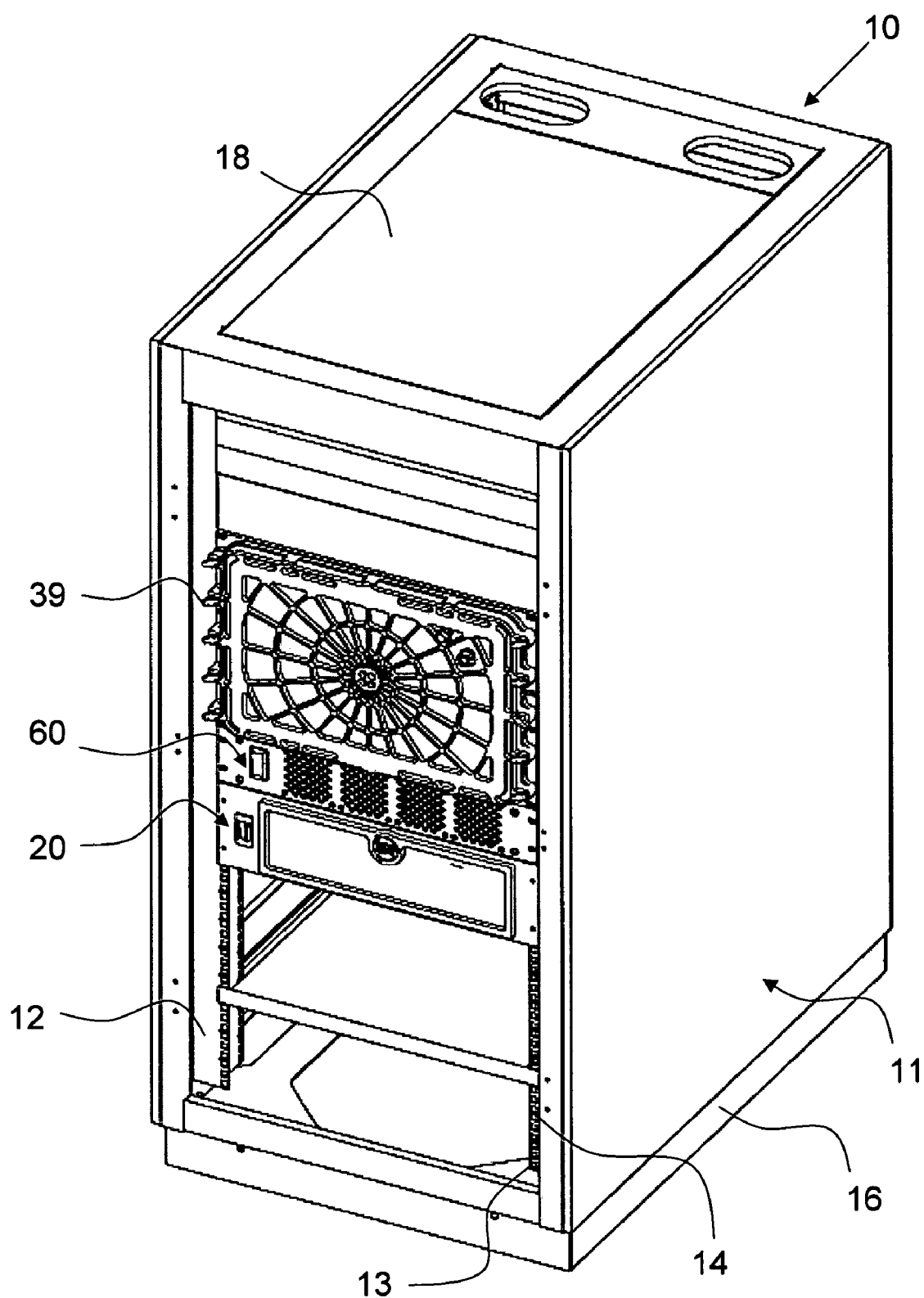
FIG. 1 is a front perspective view of the globally cooled computer system according to the present invention.
Figure 2:
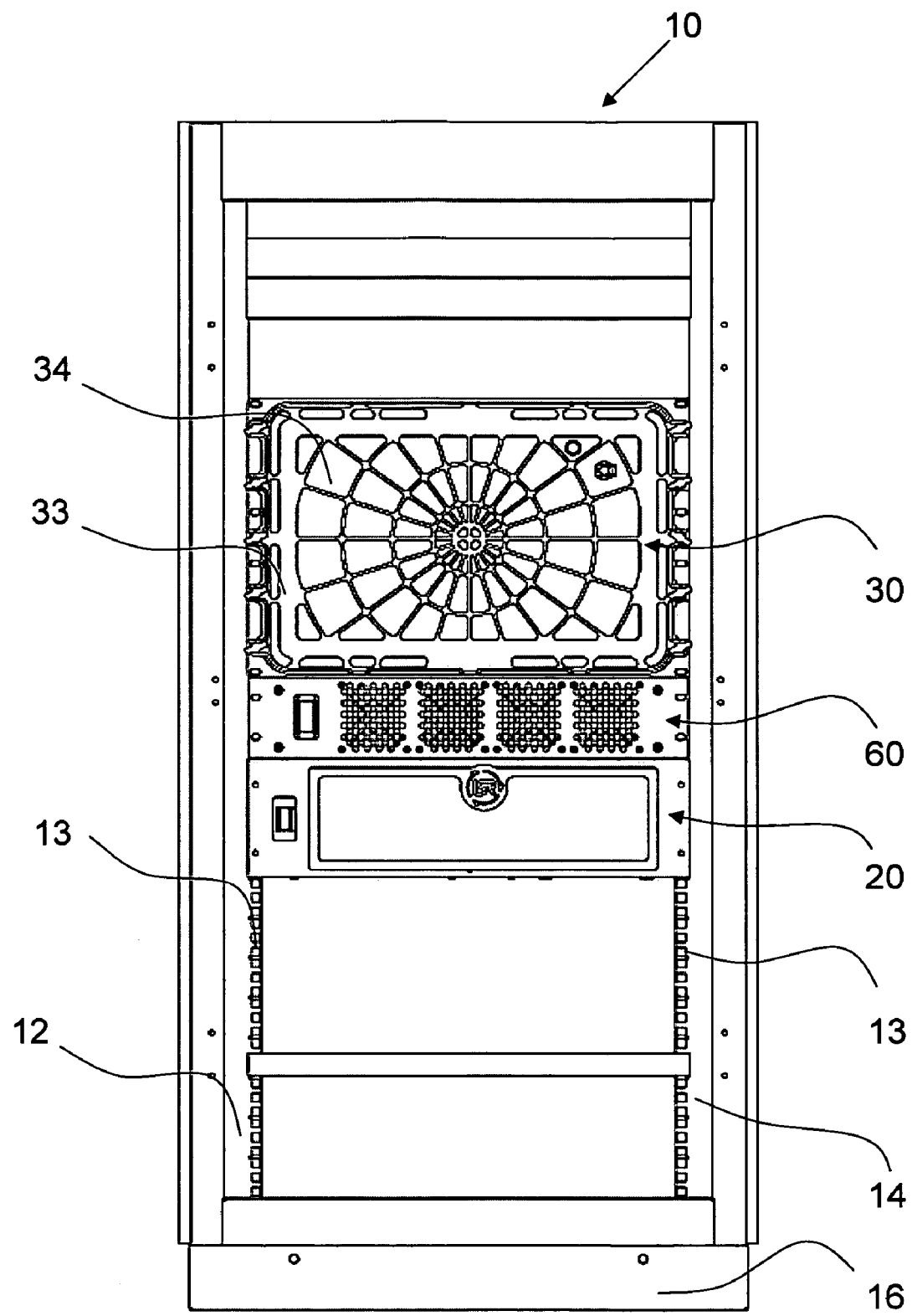
FIG. 2 is a front view of the globally cooled computer system of FIG. 1.
Figure 3:
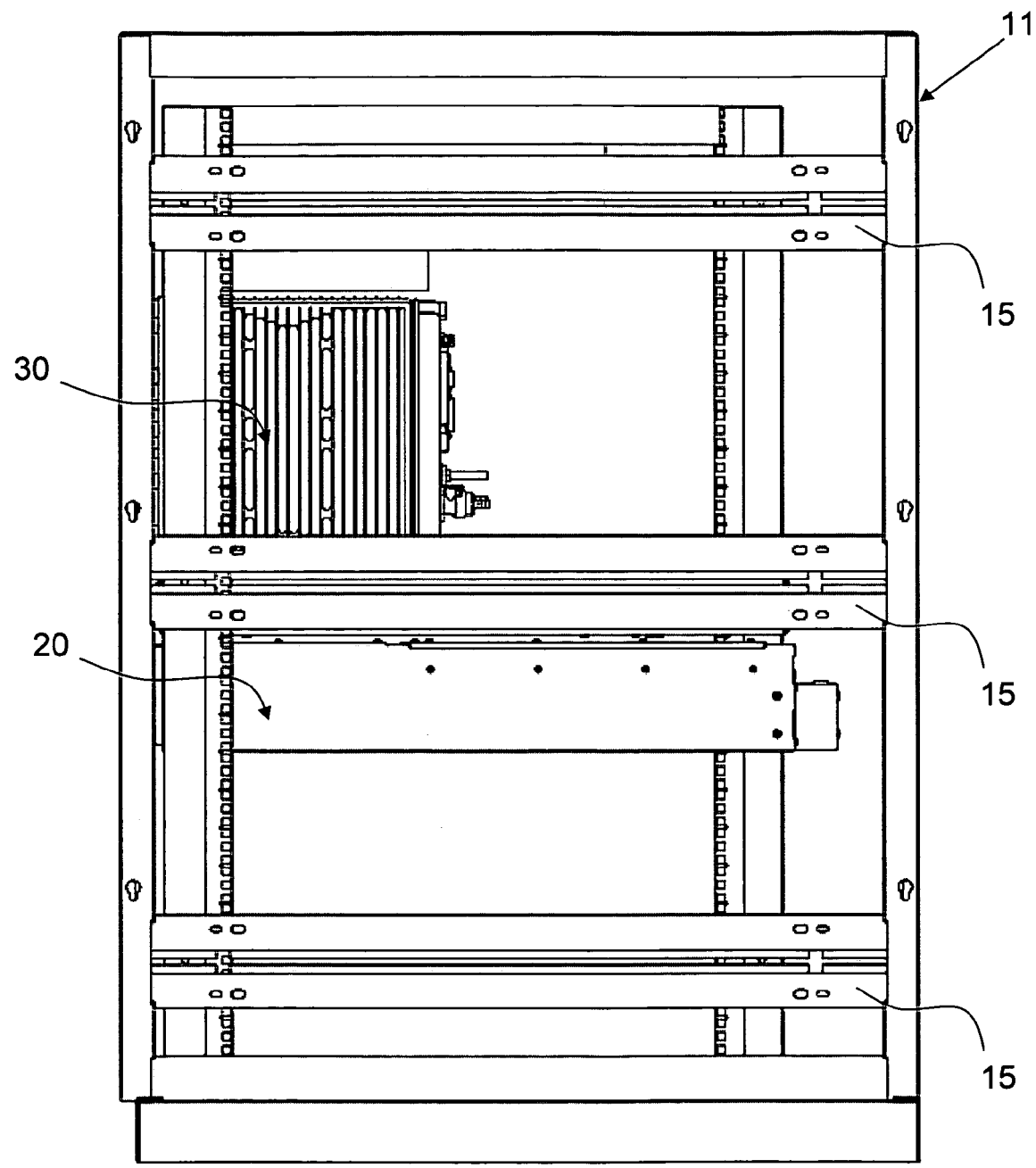
FIG. 3 is a side view of the globally cooled computer system of FIG. 1.
Figure 4:
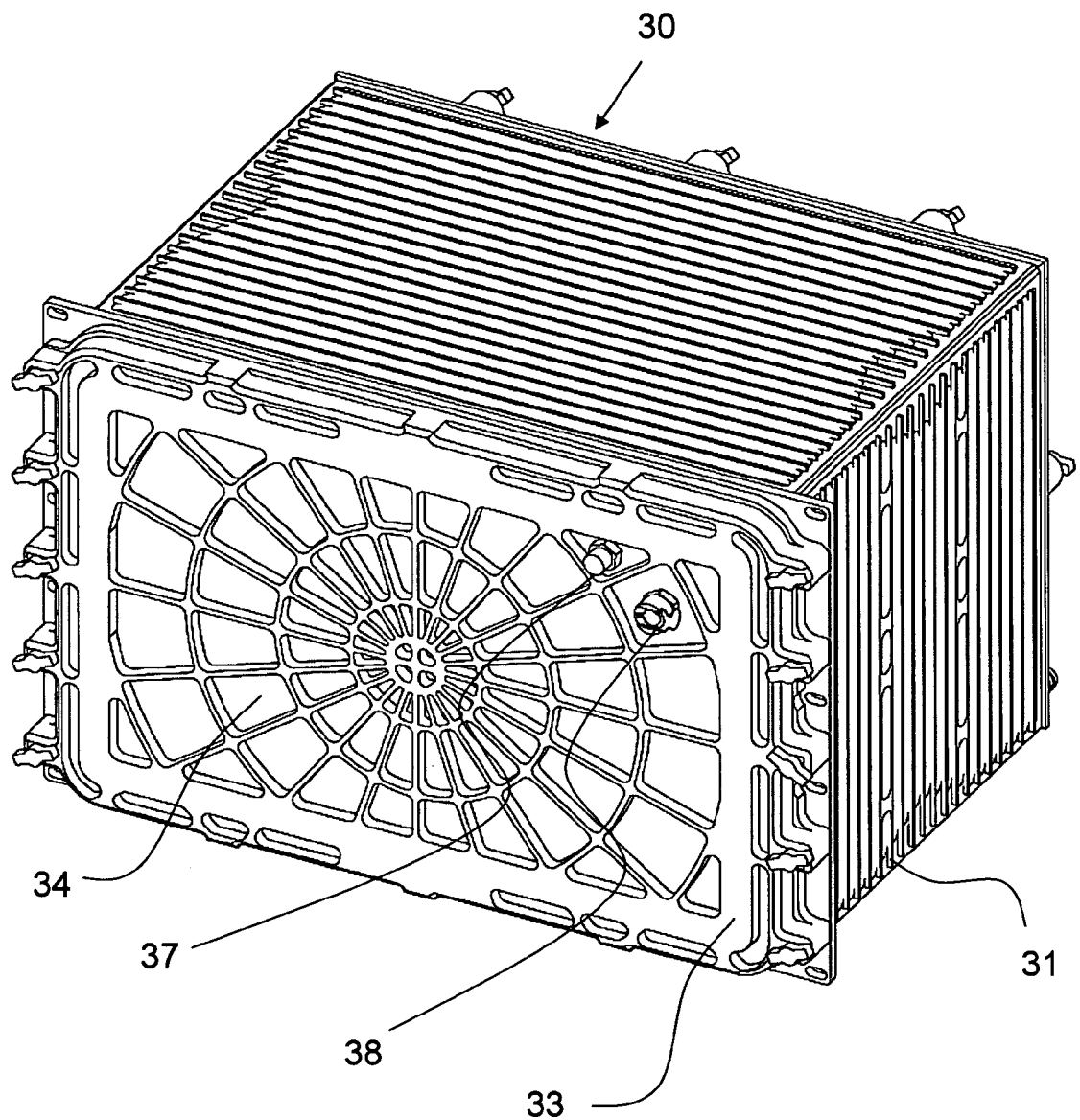
FIG. 4 is a front perspective view of the electronics unit having a clear front window.

Now referring to FIG. 1 and according to the present invention, a globally cooled computer system 10 is shown. A rack system 11 has a base 16, left rail 12, a right rail 14, and a top 18. Base 16 is used for securing computer system 10 to a foundation, which may include concrete flooring, raised computer flooring, and the like. Left rail 12 and right rail 14 allow for the securing of electronics equipment to rack system 11. Configuration flexibility is provided to the electronic equipment by means of an array of rack mounting holes 13. Typically, rack mounting holes 13 may be in a standard spacing such as to provide installation of equipment in 1.75 inch intervals. Rack top 18 may include cable feed-throughs, and provide structural support to overhead cable management troughs and the like. Rack system 11 is shown as a standard open rack system, but the present invention should not be limited to such, and may include but not be limited to, closed cabinets and sealed closed cabinets. Globally cooled computer system 10 according to the present invention does not require rack system 11, and instead may be free standing.

Figure 10:
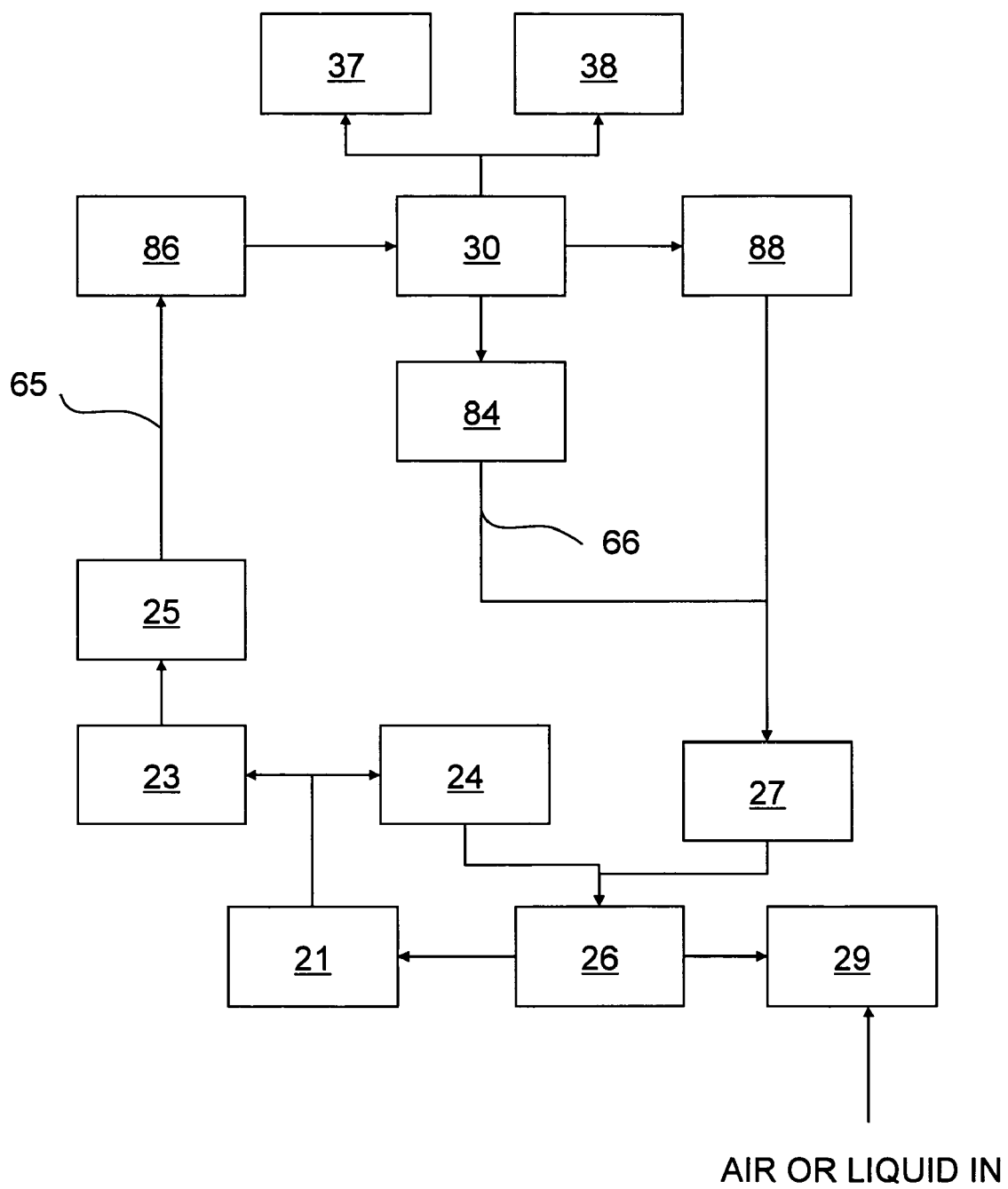
FIG. 10 is a block diagram showing the flow of fluid through the present invention.

Slidably attached to rack system 11, via a slide rail 15, is an electronics unit 30. Electronics unit 30 is a chamber which houses a plurality of electronic components (not shown), and ideally the electronic components are attached to cards. Inside electronics unit 30 is a card cage 40 for providing structural support to the one or more cards. "Electronic components", as used herein, may include CPUs, field programmable gate arrays, power conversion devices, memory devices or any heat producing electronic device. Also as used herein, "cards" may include any card typically used in an electronics system, such as but not limited to, computer devices, pizza-box style servers, blade servers, power conversion boards, communications boards (fiber optics and electrical based) and memory devices. Electronics unit 30 provides direct liquid cooling to the one or more cards secured within card cage 40 via a dielectric fluid, such as Fluorinert (commercially available through 3M). Preferably, the dielectric fluid is sprayed onto the electronic components via pressure swirl atomizers. The deposited fluid absorbs heat predominantly by way of vaporization wherein the vapor is condensed by means of a heat exchanger. The closed loop cooling cycle is shown by the block diagram of FIG. 10. Fluid is pressurized by a pump 21 within a fluid management unit 20. The pressurized fluid is delivered through both a particulate filter 23, for keeping particles from clogging sprayers, and a chemical filter 24 for controlling the amount of non-dielectric fluids which may be in the fluid and for removing accidental fluid decomposition products. Typically, chemical filter 24 will dump fluid directly back into a reservoir 26. Fluid leaving particulate filter 23 is characterized by sensor unit 25 so that a control system can regulate fluid conditions to desired levels and monitor for irregularities and maintenance needs. Fluid is delivered to electronics unit 30 via a tubing system. The fluid is sprayed onto the one or more components wherein it ideally changes phase into a vapor. The fluid is acquired from the one or more electronics unit 30 and delivered to a heat exchanger 27, which may be either a liquid-air, or liquid-liquid variety. The condensed fluid is returned to reservoir 26 to be re-pressurized by pump 21.

Fluid Management Unit

Figure 8:
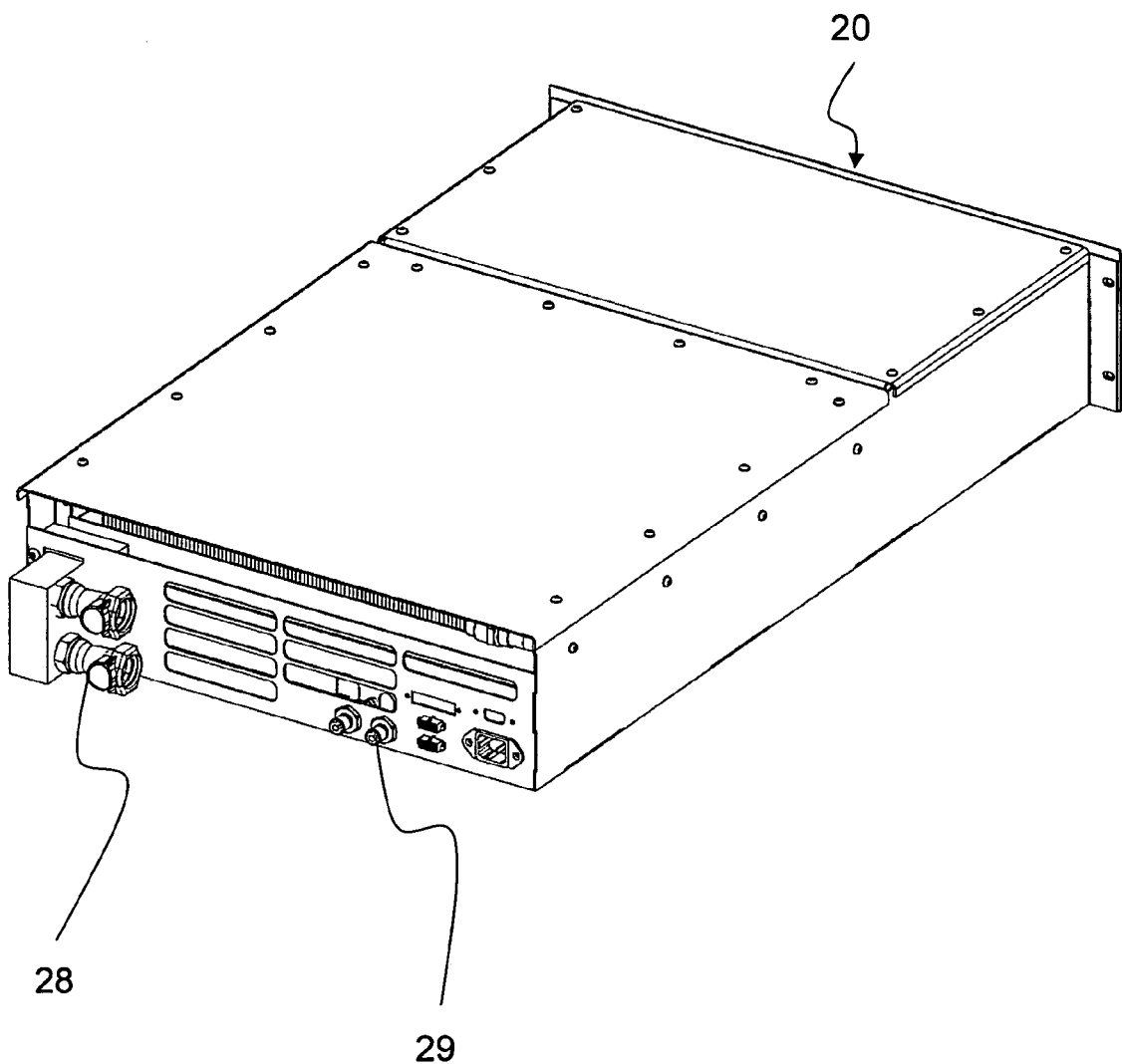
FIG. 8 is a rear perspective view of the fluid management system.

Fluid management 20, as previously described, may house pump 21, chemical filter 24, particulate filter 23, sensor unit 25, reservoir 26 and provides the means of circulating fluid to one or more electronics unit 30. In addition, fluid management unit 20 may also house features, such as but not limited to, control systems, fluid heaters, and the such. Fluid management unit 20 may also house heat exchanger 27. Due to the effects of gravity having a positive influence on pump performance, it is often preferred to put thermal management unit 20 below the one or more electronics unit 30. On the rear of fluid management unit 20 are the inputs and outputs which may include power, control and fluid. FIG. 8 shows a fluid I/O 28 which are preferably commonly available quick disconnect, self sealing type, connectors (available through Colder Products Co.). Fluid management unit 20 may have a single input and output as shown, or may have a manifold that houses many connectors that potentially support multiples of electronics unit 30. Also shown in FIG. 8 is a fluid drain port 29 which provides the ability to drain the fluid of the system at its lowest point. Tubing (not shown) may be used to transfer fluid from thermal management system 20 to electronics unit 30. Optimal tubing materials may be a function of the type of fluid used. Flexible corrugated metallic tubing can be used with many fluid types and provide configuration flexibility. Rigid tubing may also be used. Fluid management unit 20 may allow for air to pass within, or may be environmentally sealed, with the heat created within absorbed by the cooling fluid.

Electronics Unit

Electronics unit 30 preferably has a rigid housing 31 that environmentally isolates and protects the components to be cooled, and restricts the cooling fluid within. Depending upon the fluid used, the pressure within the chamber may be positive or negative in respect to atmospheric pressure. A pressure release valve 37 provides the means for escaping any unwanted non-condensable gases within the system and can be used to safely limit the potential pressure, both positive and negative, within the system. Also located on housing 31 is a housing fluid fill port 38 which is located in the vapor space for ease of filling. Housing 31 may have fins on its exterior for increased convection cooling.

Figure 5:
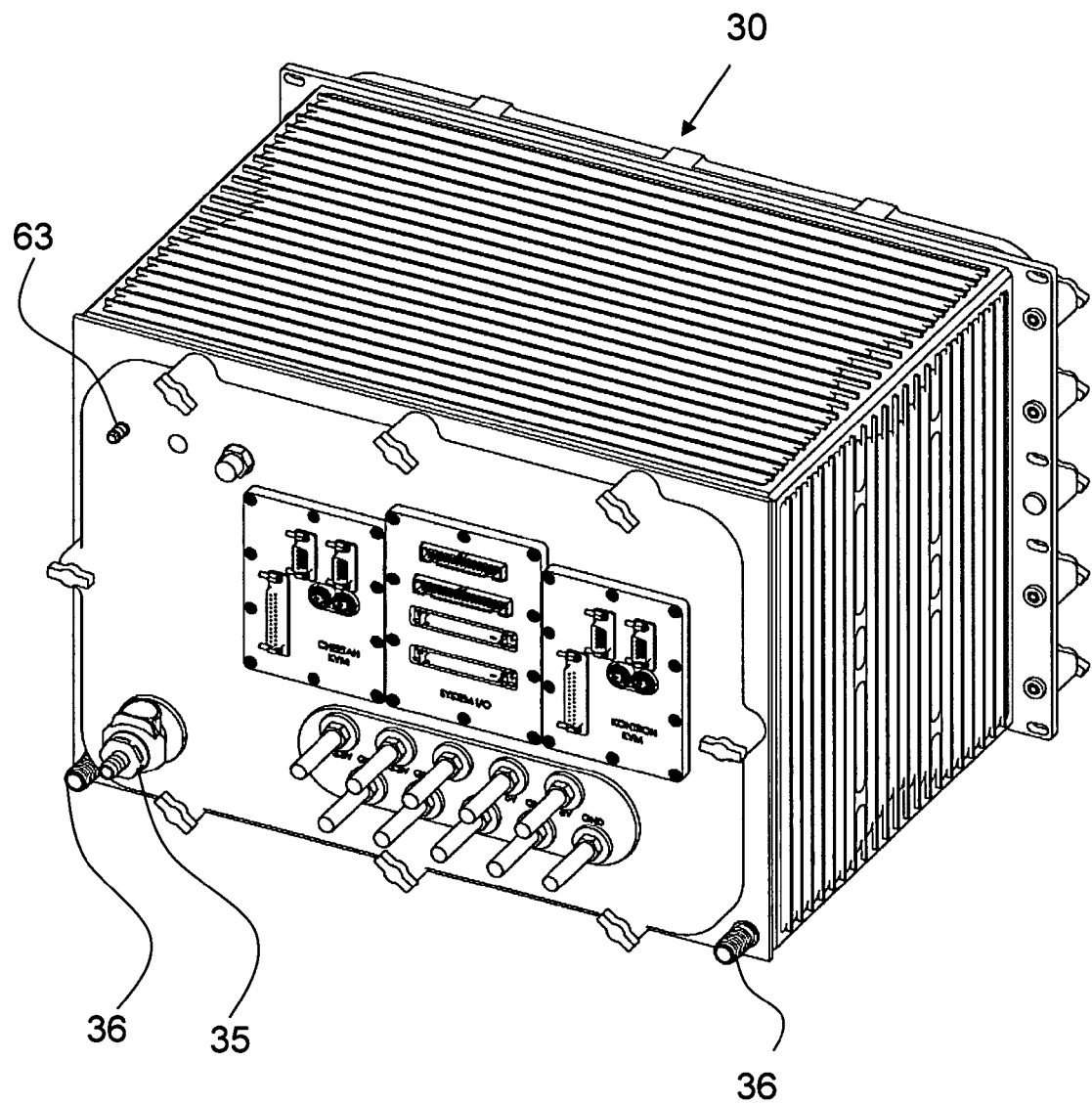
FIG. 5 is a rear perspective view of the electronics unit of FIG. 4 and showing input and outputs.
Figure 9:
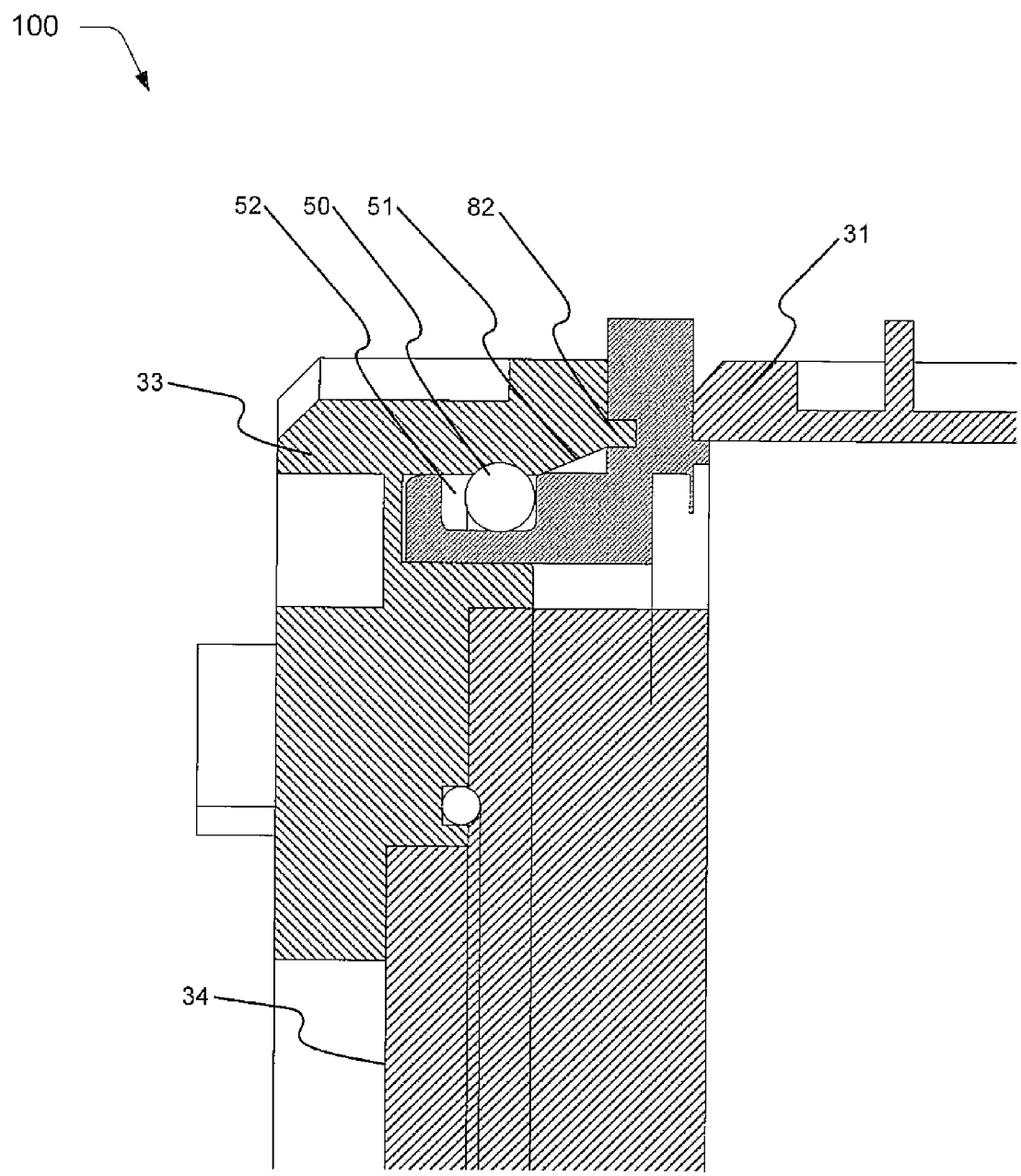
FIG. 9 is a partial section view of the front door of the electronics unit of FIG. 4 and showing a radial seal and window attachment method.

Electronics unit 30 has a door 33 for providing access to card cage 40 and the components within. A single front door 33 is shown, but multiple doors may be used, and multiple chambers can be used, such as described by U.S. patent application Ser. No. 10/648,774. FIG. 9 shows a preferred method of sealing door 33 to housing 31. Pocket 52 is recessed into housing 31 and provides a place for o-ring 50. Pocket 52, for example purposes only, has dimensions of 0.29 inches by 0.178 inches. O-ring 50 has a diameter of 0.21 inches and is preferably made from fluorosilicone material when Fluorinert is used as the cooling fluid. Located on door 33 is an incline 51 which has an angle of 20 degrees. The resulting seal structure provides a smooth seal surface as door 33 is closed. The advantage of the radial seal system versus a face seal is that the force on the door from the radial seal is lower and is in the plane of the door. The resulting structure may be less likely to leak and requires less closing force. Embedded in the seal structure of the door is a step 82 for reducing EMI emissions. A plurality of fasteners 39 (thumbscrews are shown) keep door 33 securely attached to housing 31. The rear of electronics unit 30 as shown in FIG. 5 also has a door, or access panel. Although optional, the rear door is secured similar to that of door 33.

Door 33, as shown, includes a clear window 34 which allows the user to inspect and verify the function of the system without having to open electronics unit 30. Often, operation lights are part of the front of the cards to be cooled. Window 34 allows the user to inspect the status of the operation lights, again, without having to disrupt the operation of electronics unit 30. Acrylic is a Fluorinert compatible material suitable for use as window 34 which can also have EMI shielding metallic fabric embedded or attached. A plurality of radial ribs provide structural rigidity to window 34. Window 34 may be glued in place, or sealed via o-rings and fasteners.

On the back side of housing 31 are the fluid and electrical inputs and outputs. A fluid housing inlet 35 for supplying fluid to electronics unit 30 is shown in FIG. 5. Also shown, is fluid housing outlet 36 which removes liquid and vapor from electronics unit 30. Ideally, outlet 36 is positioned vertically so that liquid can not pile up within housing 31 which could cause pool boiling and reduced heat transfer rates. Although two of outlet 36 are shown, one or more may be used. It is preferable that outlet 36 be sized to minimize back pressures between heat exchanger 27 and unit 30. Backpressures cause an increase in the boiling point of the fluid within unit 30 and a decrease in cooling performance.

Inside electronics unit 30 and on its bottom surface is a fluid ridge 71 which reduces the fluid volume needed in the system. Ridge 71, shown in FIGS. 12 and 13, protrudes off the bottom surface and forces fluid to the outside corners, or to a location where the fluid leaves the housing 31. Ridge 71 may be rectangular as shown in FIG. 13, or may be any shape, such as pyramidal thereby having a taper 89, which forces fluid to the corners under the influences of gravity.

Figure 14:
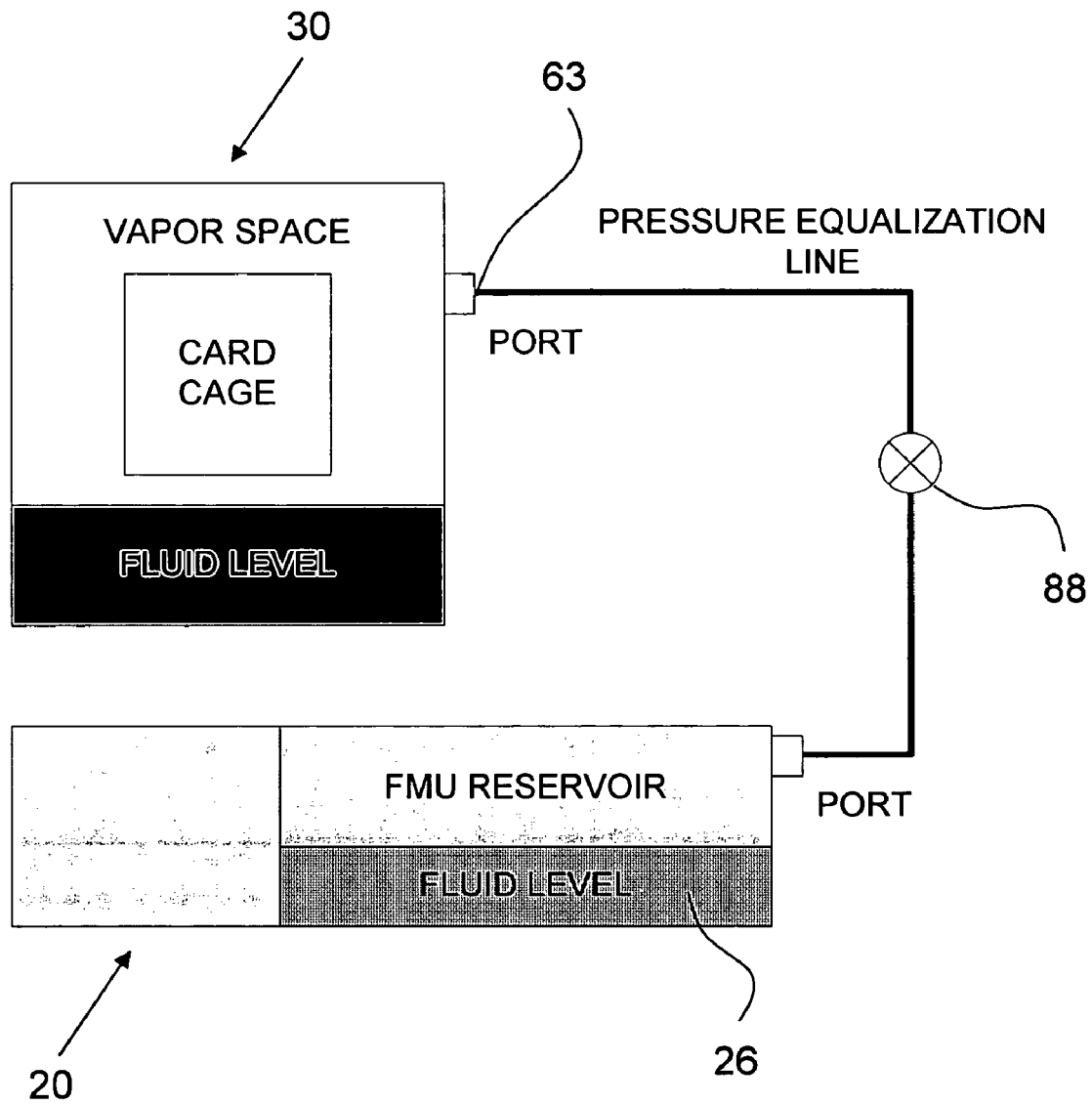
FIG. 14 is a side view showing the pressure equalization system.

Also located on the rear of electronics unit 30 is pressure equalization port 63. Port 63 allows a tube section to be placed between electronics unit 30 and fluid management unit 20, or between multiples of electronics unit 30. Ideally, port 63 is located in the vapor space of housing 31 and connected to a port located in the vapor space of either reservoir 26 or heat exchanger 27. An equalization valve 88 may be used to control the flow through port 63. A return valve 84 may be placed in the connecting tube so that the flow to unit 30 may be controlled. Likewise, a supply valve 86 may be placed in the supply line and controlled so that electronics unit 30 is supplied with the optimal amount of fluid and does not become flooded, as well as for equalizing flow rates into multiples of electronics unit 30, which may be spaced vertically or by a significant distance. Valves 84, 86 and 88 may be electronically controlled for creating optimal flow within the system based upon data collected throughout the system. In addition valves, 84, 86 and 88 may be electronically, or manually, closed to seal off unit 30 from the system during reconfigurations or for maintenance. This pressure equalization system is further illustrated in FIG. 14.

Figure 12:
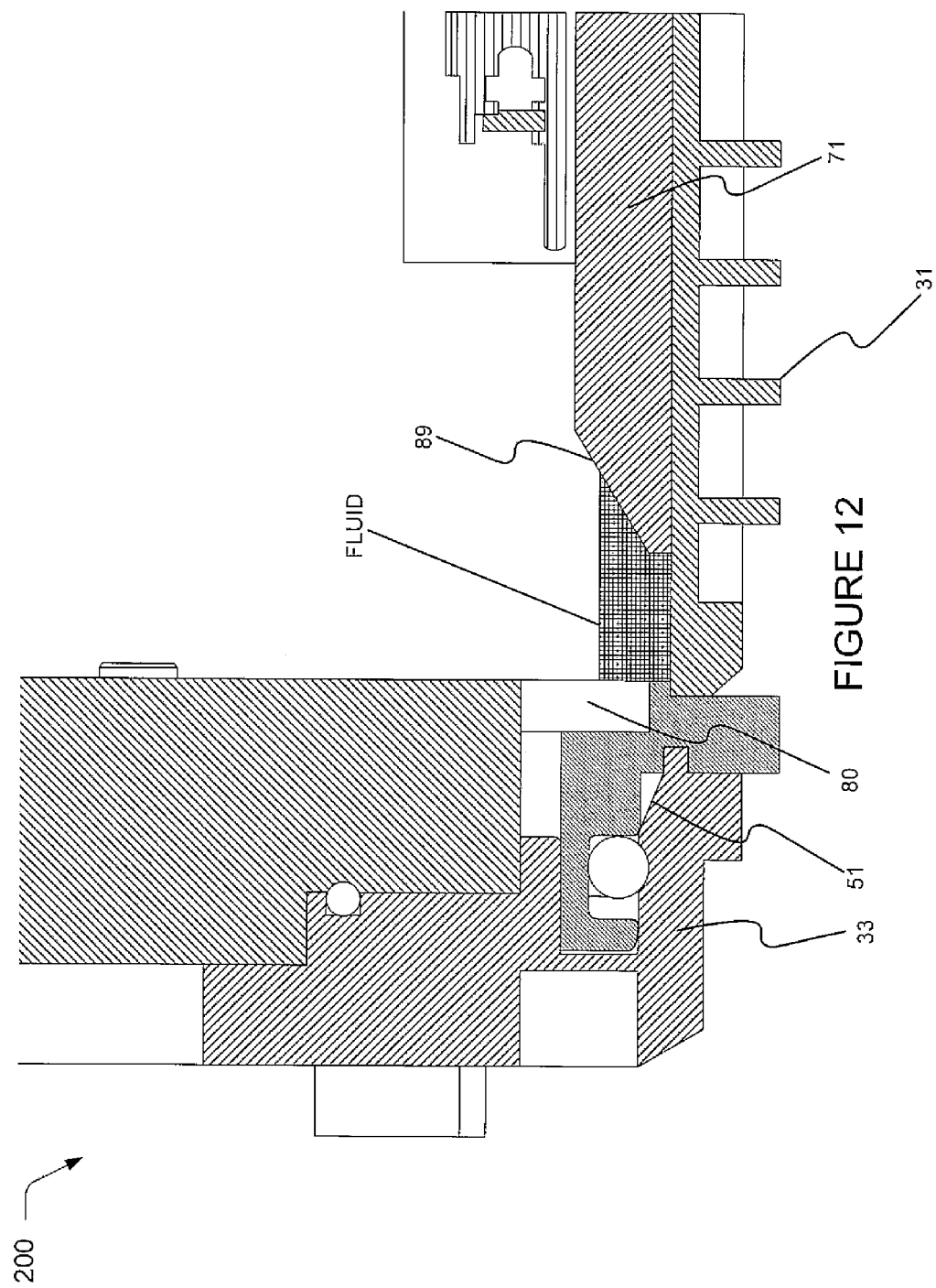
FIG. 12 is a side section view of a electronics unit showing a fluid containment flange.
Figure 13:
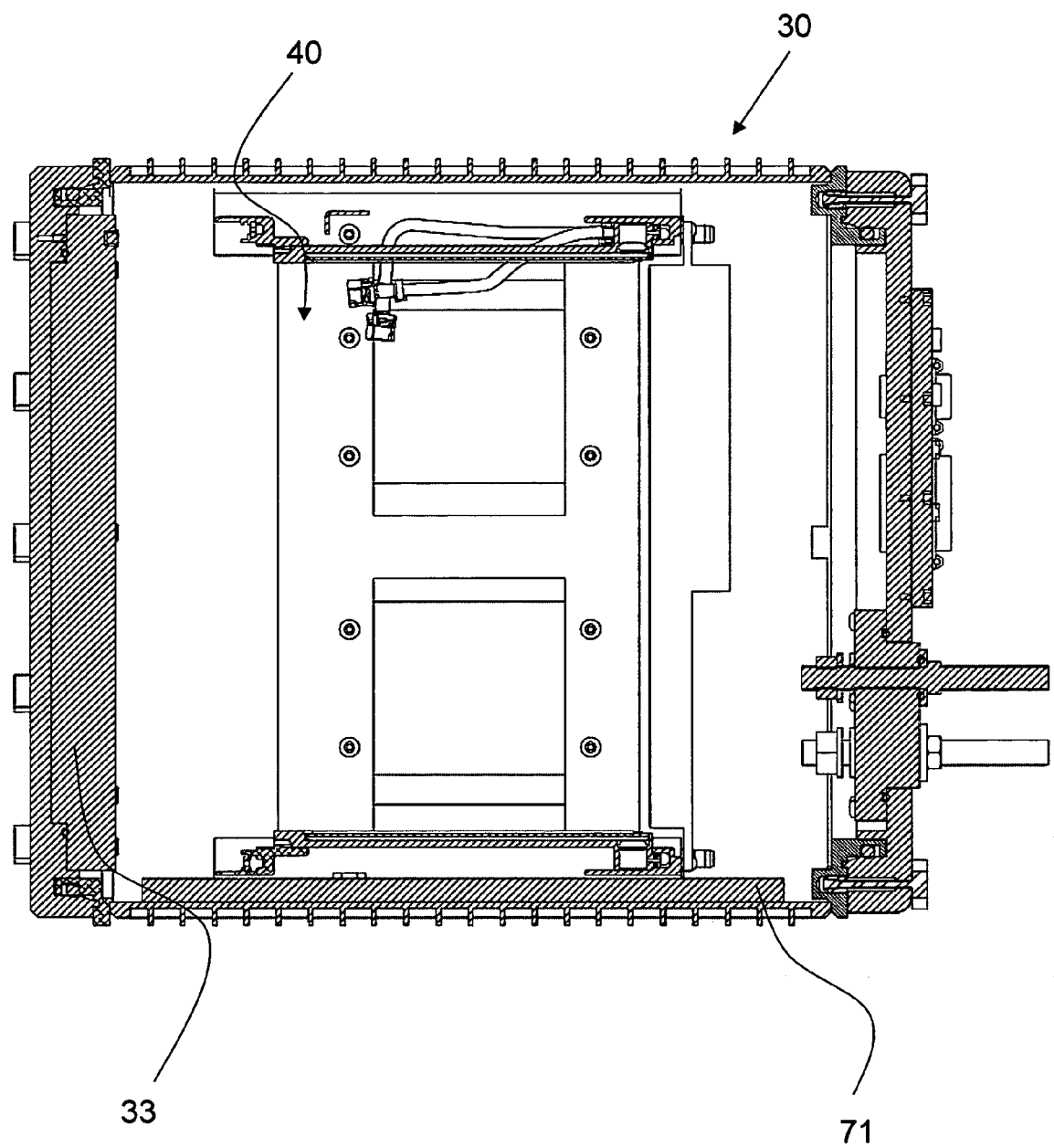
FIG. 13 is a side section view of the electronics unit having the card cage within and supported by a fluid displacing ridge.

Inside electronics unit 30, as shown in FIG. 12, has a seal flange 80 that protrudes towards the center of housing 31. Flange 80 protrudes upwards so that when door 33 is opened fluid within housing 31 is not free to run out.

Card Cage

Card cage 40 has a groove array 41 sized to allow a card to be inserted. Cards are secured to card cage 40 via fasteners into fastener array 44. A plurality of spray manifold 42 are attached to the bottom of card cage 40 and house a plurality of atomizers 43. The patterns and locations of atomizers 43 may be dependent upon the style, shape and heat load of each of the individual cards. The card cage of FIG. 6 has the ability to remove and replace individuals of spray manifold 42 as needed. Fluid is delivered to the spray manifolds by means of a tubing system (not shown) that takes fluid from housing unit input 35 and distributes it to a plurality of card cage fluid inputs 48.

The fluid deposited onto the cards may come from side spray as described, but may also be localized by the use of one or more spray modules attached to high heat generating components. Fluid can be deposited in a top-down or narrow gap fashion which creates high heat absorption rates. Localized spray modules may be connected by a tubing system to the fluid of card cage 40. Surplus fluid can fall to the bottom of electronics unit 30.

Figure 6:
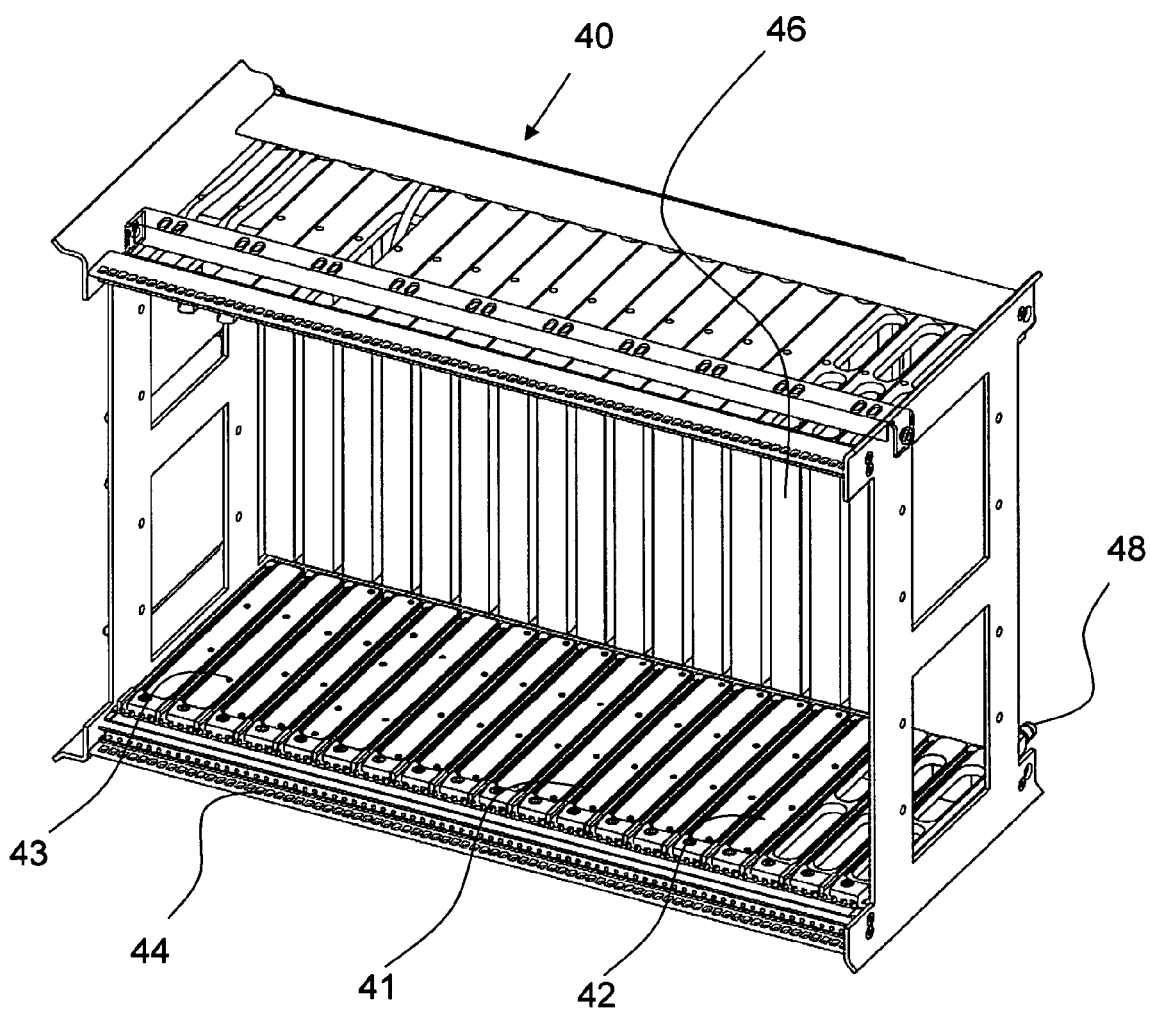
FIG. 6 is a front perspective view of the card cage for holding electrical components, and/or cards, within the electronics unit.
Figure 7:
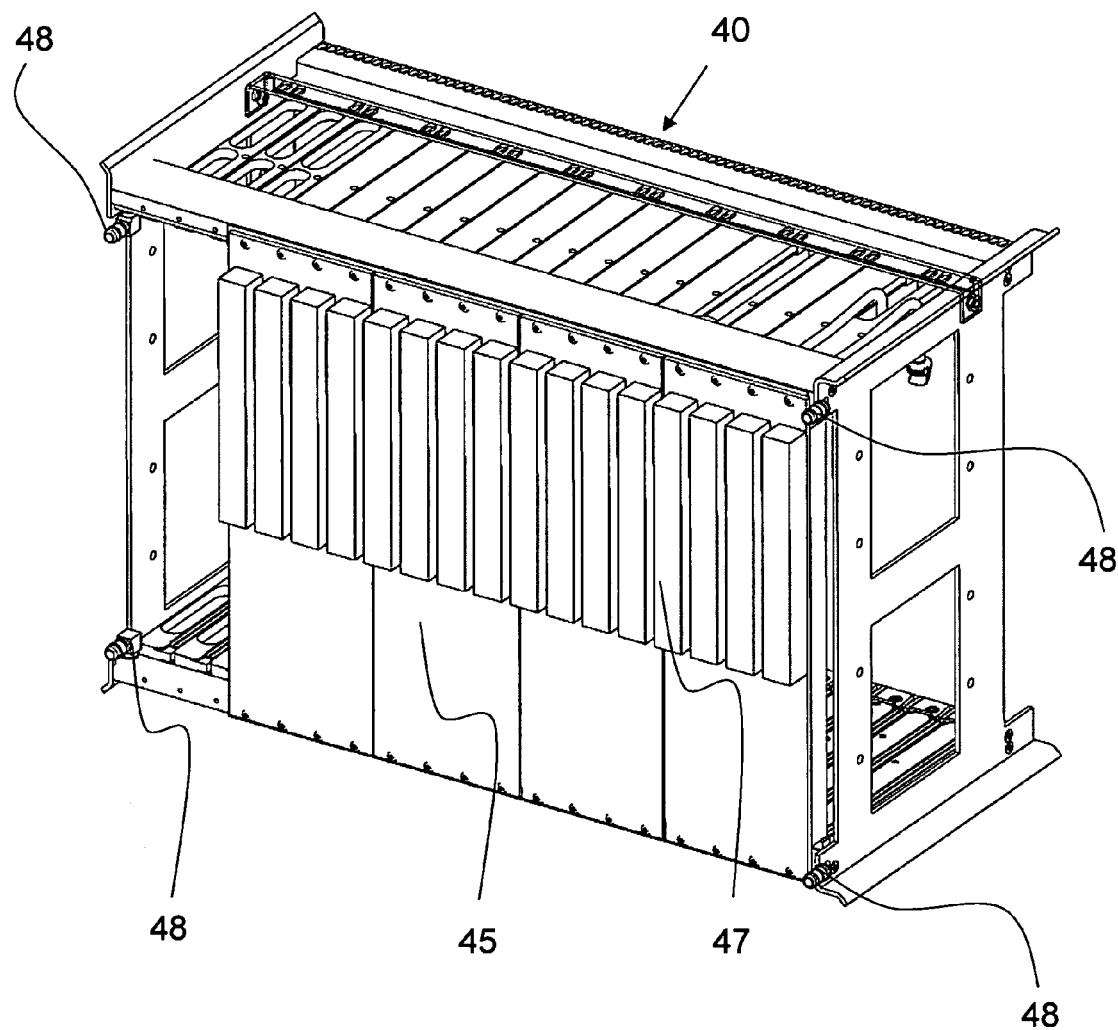
FIG. 7 is a rear perspective view of the card cage showing the rear backplane and fluid inputs.

Shown in FIG. 6, as cards are inserted down the length of groove array 41, the cards make electrical connection with an array of front connectors 46. A backplane 45 provides electrical connection with an array of rear connectors 47 and may be a single backplane or an assembly of multiple backplanes as shown in FIG. 7. The electrical signals of rear connectors 47 can be transferred to the rear electrical connectors of housing 31 (FIG. 5) by several methods including ribbon cable, discrete wiring, or methods as described by U.S. patent application Ser. No. 10/783,397.

Also shown mounted in rack system 11 is a power supply 60 for supplying power to either electronics unit 30, or fluid management unit 20, or both. Power supply 60 can bring in a wide range of power inputs and deliver the desired levels and types of power to the various components and systems. Power supply 60 may be sealed and spray cooled so its components are environmentally isolated. Power supply 60 is optional depending upon the type of electronics used. Power distribution can be made part of either fluid management unit 20 or electronics unit 30.

Preferred Embodiment

The operation of the present invention has been verified for absorbing over 3000 watts of heat within electronics unit 30. Fluorinert (a trademark of 3M), grade 5060, was used and delivered to the electronics unit 30 with a flow rate of 3 liters per minute and at a pressure of 20 pounds per square inch. Atomizers were mixed in sizes between 0.006 and 0.008 of an inch. The supply line was 0.5 inches in diameter, two 0.75 inch return lines were used, and a 0.25 inch equalization line was installed. The control system measured ambient temperatures, supply pressures and flow rates, the temperature and pressure with the cooling unit and temperatures of the supply and return fluid. A liquid to air heat exchanger was used. Although the data above is provided as a known best mode of the present invention, the present invention should not be construed to be limiting in any way. Many liquid cooling components and features are well known in the art, and described by the patents incorporated by reference to this invention, and thus do not need to be described in further detail.

Alternative Embodiments

Figure 11:
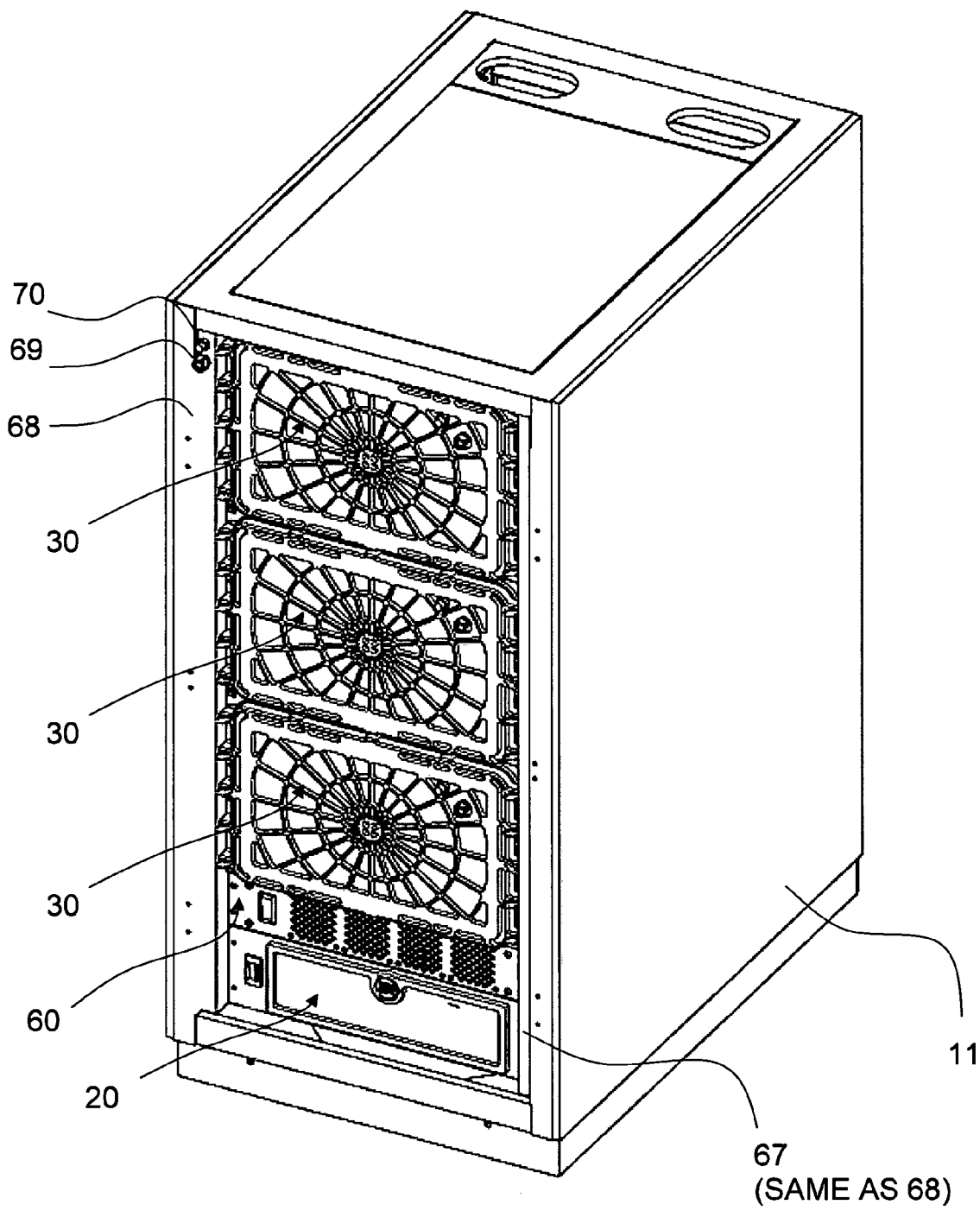
FIG. 11 is a front perspective view of an alternative embodiment of the present invention and showing a plurality of electronics units connected to a fluid management system via a rack supply manifold and a rack return manifold.

FIG. 11 shows an alternative embodiment of the present invention and shows an array of electronics unit 30 mounted above fluid management system 20. Fluid is delivered to the array of electronics unit 30 by means of a fluid supply manifold 67. Fluid supply manifold 67 is fluidly connected to electronics unit 30 by means of flexible supply lines. Similar to the supply side, the fluid returns through flexible return lines to return manifold 68 and then to the heat exchanger 27. In this configuration a rack pressure release valve is placed in the top of return manifold 68 and a fill port added to either supply manifold 67 or return manifold 68. This embodiment may use an air to liquid heat exchanger, or a liquid to liquid heat exchanger system as described by U.S. Pat. No. 10/817, 902 for a heat exchanging fluid return manifold for a liquid cooling system.

While the globally cooled computer system herein described constitute preferred embodiments of the invention, it is to be understood that the invention is not limited to these precise form of assemblies, and that changes may be made therein with out departing from the scope and spirit of the invention.

For example, within the scope of the present invention, electronics unit 30 may be a globally cooled rack mounted server having a motherboard and one or more electronic devices. With this embodiment card cage 40 is not needed, but may still provides the features and benefits as described herein for a globally cooled electronics system.

We claim:

1. A globally cooled computer system, the system comprising;
   an electronics unit having a plurality of electronics components attached to a plurality of cards and a card cage providing structural support to said plurality of cards, said electronics unit providing evaporative spray cooling to said cards,
   a fluid management unit pressurizing fluid within said electronics unit;
   a reservoir collecting fluid from said electronics unit;
   a tubing system distributing said fluid between said electronics unit and said fluid management unit; and
   a pressure equalization system connecting said electronics unit and said reservoir to equalize internal pressures therebetween, wherein the fluid management system further comprises a pump, a particulate filter, a chemical filter, a sensor unit, a reservoir, a fluid drain port, an input port, and an output port.

2. The globally cooled computer system of claim 1, wherein the electronics unit further comprises a pressure relief valve for safely limiting both positive and negative pressure within said electronics unit.

3. The globally cooled computer system of claim 1, wherein the electronics unit further comprises a housing fill port for filling said electronics unit with fluid.

4. The globally cooled computer system of claim 1, wherein the fluid management system further comprises a control system, a plurality of fluid heaters, and a heat exchanger.

5. The globally cooled computer system of claim 1, further including a power supply.

6. The globally cooled computer system of claim 1 wherein the pressure equalization system further comprises a valve for better controlling gaseous flow.

7. A globally cooled computer system, the system comprising;
   an electronics unit having a plurality of electronics components attached to a plurality of cards and a card cage providing structural support to said plurality of cards, said electronics unit providing evaporative spray cooling to said cards,
   a fluid management unit pressurizing fluid within said electronics unit;
   a reservoir collecting fluid from said electronics unit;
   a tubing system distributing said fluid between said electronics unit and said fluid management unit; and
   a pressure equalization system connecting said electronics unit and said reservoir to equalize internal pressures therebetween, wherein the pressure equalization system includes a first pressure equalization port on the rear of said electronics unit and a second pressure equalization port located on said reservoir, both said first and second pressure equalization ports located in the vapor space areas.

8. A globally cooled computer system, the system comprising;
   an electronics unit having a plurality of electronics components attached to a plurality of cards and a card cage providing structural support to said plurality of cards, said electronics unit providing evaporative spray cooling to said cards;
   a fluid management unit pressurizing fluid within said electronics unit;
   a reservoir collecting fluid from said electronics unit;
   a tubing system distributing said fluid between said electronics unit and said fluid management unit; and
   a pressure equalization system connecting said electronics unit and said reservoir to equalize internal pressures therebetween, wherein the pressure equalization system includes a first pressure equalization port on the rear of the electronics unit and a second pressure equalization port located on heat exchanger, both said first and second pressure equalization ports located in the vapor space areas.

* * * * *

UNITED STATES PATENT AND TRADEMARK OFFICE
CERTIFICATE OF CORRECTION

PATENT NO. : 7,469,551 B2  Page 1 of 1
APPLICATION NO. : 11/334269
DATED : December 30, 2008
INVENTOR(S) : Charles L. Tilton et al.

It is certified that error appears in the above-identified patent and that said Letters Patent is hereby corrected as shown below:

On the Title Page, under Inventors, item [75] please change:

Randal T. Palmer (incorrect) to Randall T. Palmer (correct)

Signed and Sealed this

Ninth Day of February, 2010

David J. Kappos
*Director of the United States Patent and Trademark Office*